(12) United States Patent
Joo et al.

(10) Patent No.: US 7,560,383 B2
(45) Date of Patent: Jul. 14, 2009

(54) METHOD OF FORMING A THIN LAYER AND METHOD OF MANUFACTURING A NON-VOLATILE SEMICONDUCTOR DEVICE USING THE SAME

(75) Inventors: Kyong-Hee Joo, Gyeonggi-do (KR); Yong-Won Cha, Gyeonggi-do (KR); Seung-Hyun Lim, Seoul (KR); In-Seok Yeo, Seoul (KR); Kyu-Tae Na, Seoul (KR)

(73) Assignee: Samsung Electronics Co., Ltd. (KR)

( * ) Notice: Subject to any disclaimer, the term of this patent is extended or adjusted under 35 U.S.C. 154(b) by 352 days.

(21) Appl. No.: 11/398,217

(22) Filed: Apr. 5, 2006

(65) Prior Publication Data

US 2006/0246661 A1 Nov. 2, 2006

(30) Foreign Application Priority Data

Apr. 8, 2005 (KR) .................. 10-2005-0029290

(51) Int. Cl.
*H01L 21/44* (2006.01)
(52) U.S. Cl. .................................................. 438/680

(58) Field of Classification Search ......... 438/679–681, 438/769–794; 257/639–649
See application file for complete search history.

(56) References Cited

U.S. PATENT DOCUMENTS

| 6,759,344 B2 | 7/2004 | Matsuki et al. |
| 6,831,324 B2 | 12/2004 | Sandhu et al. |
| 7,098,147 B2 * | 8/2006 | Nansei et al. ............... 438/769 |
| 2006/0078690 A1 * | 4/2006 | Lee et al. .................... 427/569 |

FOREIGN PATENT DOCUMENTS

KR 1020010111448 A 12/2001

* cited by examiner

*Primary Examiner*—Calvin Lee
(74) *Attorney, Agent, or Firm*—Myers Bigel Sibley & Sajovec, P.A.

(57) ABSTRACT

In a method of forming a thin layer having a desired composition, a source gas is provided onto a substrate loaded in a chamber for a first time, and the source gas is chemisorbed onto the substrate. While the source gas is provided, a plasma is generated in the chamber for a second time to change the chemisorbed source gas into the thin layer having the desired composition. The thin layer may have a stoichiometrical composition or a non-stoichiometrical composition.

27 Claims, 12 Drawing Sheets

METHOD OF FORMING A THIN LAYER AND METHOD OF MANUFACTURING A NON-VOLATILE SEMICONDUCTOR DEVICE USING THE SAME

CROSS-REFERENCE TO RELATED APPLICATIONS

This application claims priority under 35 USC § 119 to Korean Patent Application No. 2005-29290 filed on Apr. 8, 2005, the contents of which are herein incorporated by reference in their entirety.

FIELD OF THE INVENTION

The present invention relates generally to a method of forming a thin layer and a method of manufacturing a non-volatile semiconductor device using the same, and, more particularly, to a method of forming a thin layer of which a composition may be controlled easily, and a method of manufacturing a non-volatile semiconductor device including a storage layer pattern having a nanocrystalline structure using the same.

BACKGROUND OF THE INVENTION

As semiconductor devices have become highly integrated, about 70 nm may be a critical dimension. Next-generation semiconductor devices having critical dimensions below about 70 nm present difficulties to conventional manufacturing techniques, such as mis-operation due to non-uniformity of a number of electrons, resistance-capacitance (RC) delay, a leakage current over a permissible value due to a tunneling effect of a gate insulation layer, mis-operation due to thermal and quantum mechanical vibrations.

In order to overcome the above-mentioned problems, developing a new method of manufacturing a semiconductor device based on different phenomena and principles compared to present techniques is needed.

When a particle has a nanometer-scale size, physical properties of the particle follows quantum mechanics instead of classical mechanics, and therefore the particle has characteristics such as electron tunneling in a quantum well, a characteristic of electrons that are restricted to a low dimension, a wave property of electrons, etc.

Hereinafter, the problems occurring according as the semiconductor device becomes highly integrated will be illustrated in detail.

A common non-volatile semiconductor device includes a floating gate electrode capable of inputting and outputting charges between a tunnel oxide layer and a control oxide layer. A thickness of the floating gate electrode included in a non-volatile semiconductor device has to be thinner as a critical dimension of gate structures of the non-volatile semiconductor device becomes thinner. For example, when the critical dimension of the gate structures is about 90 nm, the thickness of the floating gate electrode has to be about 8 nm. In addition, when the critical dimension of the gate structures is about 65 nm, the thickness of the floating gate electrode has to be about 6 nm. Moreover, when the critical dimension of the gate structures is about 45 nm, the thickness of the floating gate electrode has to be about 3 nm. However, when the thickness of the floating gate electrode is below about 6 nm, a leakage current of the floating gate electrode increases over a permissible value. Thus, charge cannot be stored in the floating gate electrode, and the non-volatile semiconductor device cannot function properly.

Nowadays, in order to overcome a scaling limit of non-volatile semiconductor devices, nanocrystalline materials are used as means for storing charge instead of the floating gate electrode.

In a non-volatile semiconductor device using nanocrystalline materials, charges are dispersedly trapped in hundreds of the nanocrystalline materials so that storing charge is not seriously affected even though several nanocrystalline materials have defects. Thus, a non-volatile semiconductor device using nanocrystalline materials can have a reduced leakage current so as to be highly integrated in comparison with a non-volatile semiconductor device including the floating gate electrode. Nanocrystalline silicon is primarily being researched as the nanocrystalline material.

As one method of forming nanocrystalline silicon, a common chemical vapor deposition (CVD) process can be used. However, in the CVD process, controlling deposition time and temperature is not easy; therefore, nanocrystalline silicon has difficulty in achieving proper particle sizes, a uniform distribution, and a uniform density. In addition, nanocrystalline silicon formed by the CVD process has a large step difference so that performing successive processes is difficult.

As another method of forming nanocrystalline silicon, after forming a silicon oxide layer having a high content of silicon, that is, a silicon-rich oxide layer, the nanocrystalline silicon in the silicon-rich oxide layer is extracted. For example, a process for forming the silicon-rich oxide layer includes a low-pressure CVD (LPCVD) process, a plasma-enhanced CVD (PECVD) process, an electron beam evaporation process, etc.

By the above-mentioned processes, however, a stoichiometrically stable silicon oxide layer can be easily formed, and in the stoichiometrically stable silicon oxide layer, nanocrystalline silicon is never extracted. Additionally, even though a non-stoichiometrical silicon oxide layer is formed by the processes, silicon content included in the silicon-rich oxide layer is not uniform so that forming a thin film including nanocrystalline silicon having proper particle sizes, a uniform distribution, and a uniform density is very difficult.

When nanocrystalline silicon does not have the proper particle sizes, the uniform distribution, and the uniform density, an amount of charge able to be stored in nanocrystalline silicon varies. Thus, a non-volatile semiconductor device including nanocrystalline silicon having the non-uniform particle sizes and distribution does not operate reproducibly.

SUMMARY OF THE INVENTION

Some embodiments of the present invention provide a method of forming a thin layer of which a composition may be controlled easily.

Some embodiments of the present invention provide a method of manufacturing a non-volatile semiconductor device including a nanocrystalline storage layer pattern having proper particle sizes, a uniform crystalline distribution and a uniform density.

According to some embodiments of the present invention, there is provided a method of forming a thin layer wherein a first source gas is provided onto a substrate loaded in a chamber for a first time to chemisorb the first source gas onto the substrate. A plasma is periodically generated in the chamber for a second time while providing the first source gas onto the substrate to change the chemisorbed first source gas into a first thin film having a desired composition. The second time may be substantially shorter than the first time.

In some embodiments of the present invention, the plasma may be periodically and repeatedly generated while providing the first source gas onto the substrate.

In some embodiments of the present invention, the second time may be in a range of about 0.05 seconds to about 5 seconds.

In some embodiments of the present invention, the plasma may be periodically generated by applying a plasma power of about 1,000 W to about 7,000 W and a bias power of about 10 W to about 5,000 W.

In some embodiments of the present invention, a second source gas may be provided onto the first thin film for a third time to chemisorb the second source gas onto the first thin film. A plasma may be periodically generated in the chamber for a fourth time while providing the second source gas onto the first thin film to change the chemisorbed second source gas into a second thin film. The fourth time may be substantially shorter than the third time and the second thin film may have a composition substantially different from that of the first thin film.

In some embodiments of the present invention, the first source gas may include an oxygen ($O_2$) gas and a silane ($SiH_4$) gas by a flow rate ratio of about 0.005:1.0 to about 2.0:1.0, and the first thin film may comprise silicon oxide.

In some embodiments of the present invention, the first source gas may include an oxygen gas and a silane gas by a flow rate ratio of about 0.4:1.0 to about 0.8:1.0, and the first thin film may include silicon oxide.

In some embodiments of the present invention, a method of forming the thin layer may include extracting crystalline silicon in the first thin film by a heat treatment process.

In some embodiments of the present invention, the first source gas may include an ammonia ($NH_3$) gas, a nitrous oxide ($N_2O$) gas and a silane gas, and the first thin film may include silicon oxynitride.

According to some embodiments of the present invention, there is a method of manufacturing a non-volatile semiconductor device wherein a tunnel oxide layer is formed on a substrate. A source gas is provided onto the substrate for a first time to chemisorb the source gas onto the tunnel oxide layer. The source gas includes a silicon source gas. A plasma is generated over the substrate for a second time while providing the source gas onto the substrate to change the chemisorbed source gas into a preliminary storage layer. The second time may be substantially shorter than the first time. A control oxide layer is formed on the preliminary storage layer. Crystalline silicon in the preliminary storage layer is extracted by performing a heat treatment process on the preliminary storage layer to change the preliminary storage layer into a nanocrystalline silicon storage layer. A control electrode layer is formed in the control oxide layer. The control electrode layer, the control oxide layer, the nanocrystalline silicon storage layer and the tunnel oxide layer are patterned to form a gate structure on the substrate.

In some embodiments of the present invention, the plasma may be periodically and repeatedly generated while providing the source gas onto the substrate.

In some embodiments of the present invention, the second time may be in a range of about 0.05 seconds to about 5 seconds.

In some embodiments of the present invention, the plasma may be periodically generated by applying a plasma power of about 1,000 W to about 7,000 W and a bias power of about 10 W to about 5,000 W.

In some embodiments of the present invention, the first source gas may include an oxygen ($O_2$) gas and a silane ($SiH_4$) gas by a flow rate ratio of about 0.4:1.0 to about 0.8:1.0.

In some embodiments of the present invention, preliminary storage layer may have a composition including silicon and oxygen by an atomic ratio of about 1.0:0.1 to about 1.0:1.8.

In some embodiments of the present invention, the preliminary storage layer may have a thickness of about 30 Å to about 150 Å.

In some embodiments of the present invention, the tunnel oxide layer may have a thickness of about 10 Å to about 50 Å.

In some embodiments of the present invention, the heat treatment process may be performed at a temperature of about 700° C. to about 1,100° C. under an inactive gas atmosphere.

In some embodiments of the present invention, the heat treatment process may be performed at a temperature of about 700° C. to about 1,100° C. under a mixed gas atmosphere including an oxygen gas and an inactive gas.

In some embodiments of the present invention, the heat treatment process may be performed for about 20 minutes to about 80 minutes.

In some embodiments of the present invention, the heat treatment process may be performed using a heat radiation produced by a flash lamp for about 10 ms. The flash lamp may include a xenon lamp.

In some embodiments of the present invention, before providing the source gas onto the substrate, a surface portion of the tunnel oxide layer may be nitrified to form a nitride layer on the tunnel oxide layer.

In some embodiments of the present invention, the gate structure may have a width below about 70 nm.

According to some embodiments of the present invention, before generating a plasma, a source gas having a proper composition for forming a thin layer is provided so that the thin layer may have not only a stoichiometrical composition but also a non-stoichiometrical composition.

In addition, a thin layer having a nanocrystalline structure may be formed to have proper particle sizes, a uniform distribution, and a uniform density by using the thin layer having the proper composition.

Furthermore, a highly integrated non-volatile semiconductor device having a good capacity may be manufactured by using a nanocrystalline storage layer pattern having the proper particle sizes, a uniform distribution, and a uniform density.

BRIEF DESCRIPTION OF THE DRAWINGS

The above and other features and advantages of the present invention will become more apparent by describing embodiments thereof with reference to the accompanying drawings, in which.

DESCRIPTION OF THE EMBODIMENTS

Figure 1:
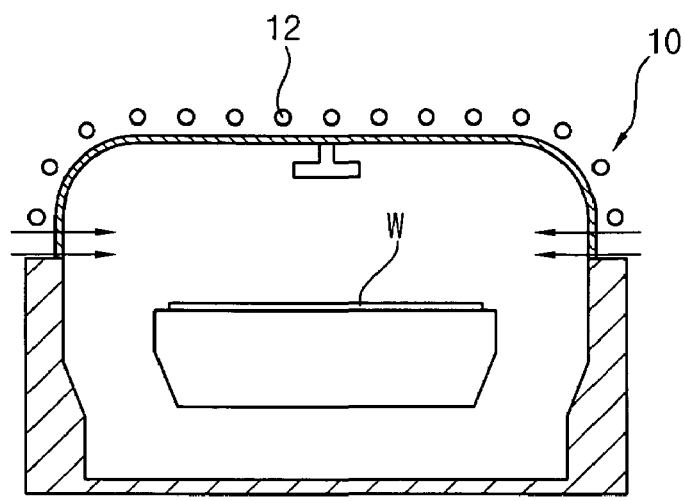
FIGS. 1 and 2 are cross-sectional views illustrating a method of forming a thin layer in accordance with some embodiments of the present invention.

The present invention is described more fully hereinafter with reference to the accompanying drawings, in which some embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some embodiments of the invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, some embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming a Thin Layer

Figure 2:
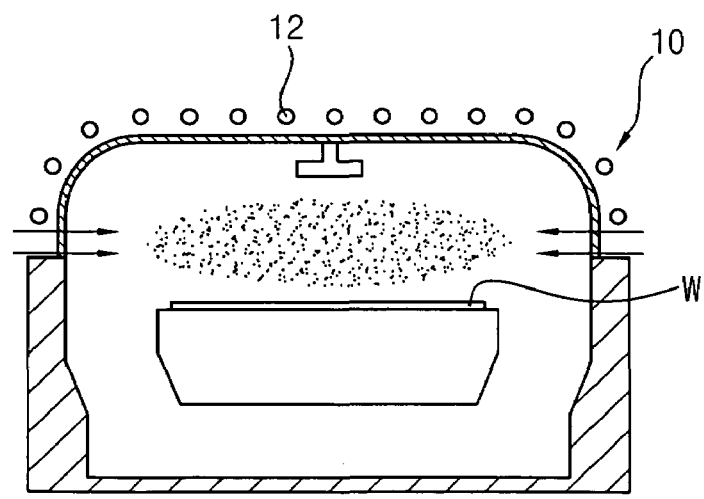

FIGS. 1 and 2 are cross-sectional views illustrating a method of forming a thin layer in accordance with an embodiment of the present invention.

Referring to FIG. 1, a substrate W is loaded into a chamber 10 for a high-density plasma (HDP) process. An inactive gas is introduced into the chamber 10 until the chamber 10 has a desired temperature and a desired pressure. For example, the chamber 10 has a temperature of about 10° C. to about 100° C. The inactive gas may include an argon (Ar) gas, a nitrogen ($N_2$) gas, a helium (He) gas, etc.

A coil 12 is disposed to enclose an upper portion and a side portion of the chamber 10. The coil 12 generates a plasma over the substrate W loaded in the chamber 10. The coil 12 may induce an electromagnetic field in the chamber 10 so as to generate a power substantially higher than a power typically generated by a conventional plasma-enhanced chemical vapor deposition (PECVD) apparatus.

After introducing the inactive gas into the chamber 10 is stopped, a source gas is provided onto the substrate W for a first time. The source gas is chemically absorbed (i.e., chemisorbed) onto the substrate W. The source gas may have a proper composition suitable for forming the thin layer having a desired composition.

Referring to FIG. 2, while introducing the source gas into the chamber 10, the plasma is generated over the substrate W for a second time substantially shorter than the first time to thereby convert the chemisorbed source gas into the thin layer having the desired composition on the substrate 10.

While providing the source gas onto the substrate W, the plasma may be generated at least once. That is, while providing the source gas onto the substrate W, the power for generating the plasma may be turned on and turned off at least once. The thin layer may be formed on the substrate W for the second time only. Namely, the thin layer is formed on the substrate W by the plasma. In some embodiments of the present invention, the plasma may be periodically generated over the substrate W while the source gas is provided onto the substrate W.

Hereinafter, a method of forming a thin layer in accordance with some embodiments of the present invention will be illustrated in detail.

Figure 3:
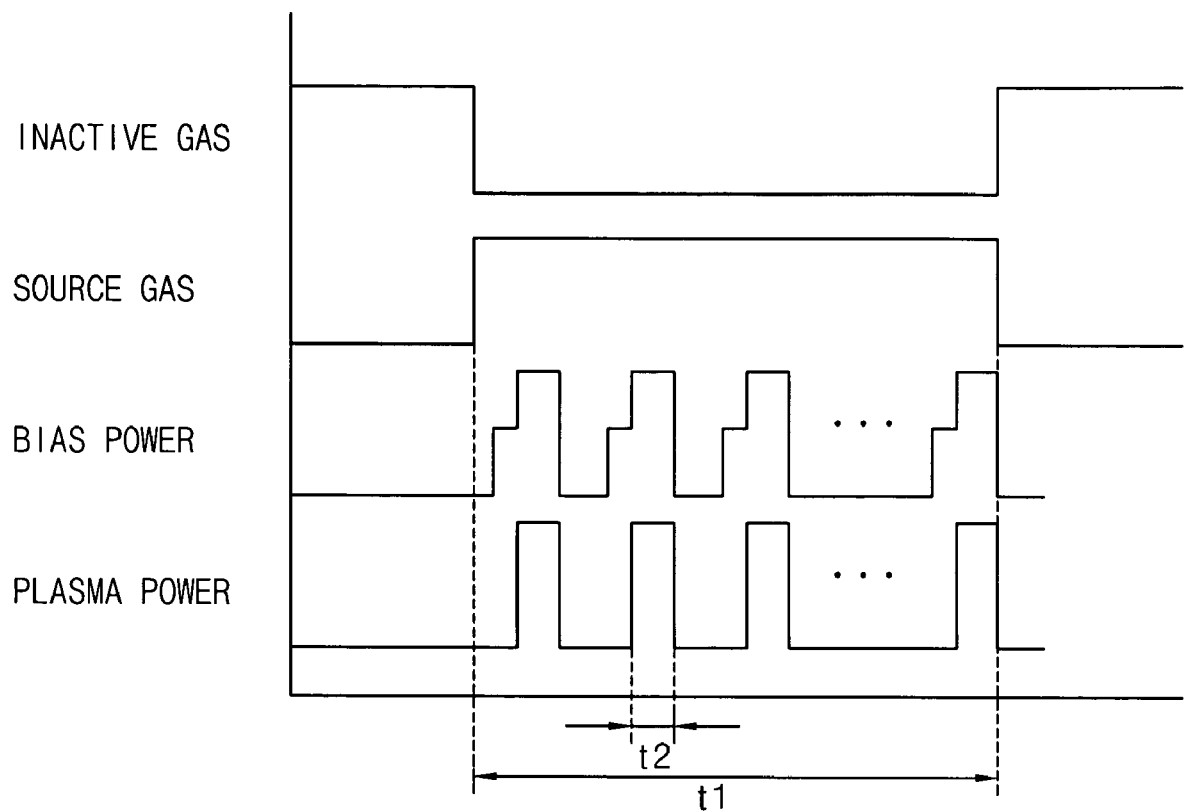
FIG. 3 is a timing diagram illustrating feeding times of gases and applying times of powers for forming a thin layer in accordance with some embodiments of the present invention.

FIG. 3 is a timing diagram illustrating feeding times of gases and applying times of powers for forming a thin layer in accordance with some embodiments of the present invention.

Referring to FIG. 3, an inactive gas is introduced into a chamber. The inactive gas may include an argon gas, a nitrogen gas, a helium gas, etc.

After introducing the inactive gas into the chamber is stopped, a first source gas is provided onto a substrate loaded in the chamber for a first time t1. The first source gas is chemisorbed onto the substrate.

While providing the first source gas onto the substrate, a first plasma is generated in the chamber for a second time t2 substantially shorter than the first time t1. Thus, the chemisorbed first source gas is changed into a first thin film on the substrate.

In some embodiments of the present invention, a bias power of about 10 W to about 5,000 W may applied to the substrate and a plasma power of about 1,000 W to about 7,000 W may be applied to the chamber so as to generate the first plasma over the substrate. While providing the first source gas onto the substrate, the first plasma may be periodically generated a desired number of times.

While introducing the first source gas into the chamber, the bias power and the plasma power may be turned on for the second time t2, and then turned off. Additionally, the bias power and the plasma power may be turned on for the second time t2, and then turned off, repeatedly. Only for the second time t2 in which the first plasma is generated, the first thin film may be formed on the substrate. This process for forming the first thin film on the substrate may be repeatedly performed so that a first thin layer having a desired thickness may be formed on the substrate. Since each of the first thin films has a desired composition controlled by the first source gas and the first plasma, the first thin layer may have the desired composition. Thus, all portions of the first thin layer may have uniform characteristics.

When the second time t2 for generating the first plasma is below about 0.05 seconds, the first thin layer may not be formed on the substrate and the first plasma may not be uniformly formed over the substrate. On the other hand, when the second time t2 for generating the first plasma is above about 5 seconds, the first thin layer may not have the desired composition and may have an exceedingly thick thickness. Thus, the second time t2 for generating the first plasma may be advantageously in a range of about 0.05 seconds to about 5 seconds. Since the first thin films are instantly formed on the substrate only for the second time t2 when the first plasma is generated, the first thin layer may have a very thin thickness below about 10 Å by varying the second time t2 and a generation period of the first plasma.

In some embodiments of the present invention, a time when the bias power and the plasma power are turned off (that is, a time when the first plasma is not generated) may be in the range of about 0.05 seconds to about 5 seconds.

When the first source gas includes a silane ($SiH_4$) gas and an oxygen ($O_2$) gas, the first thin layer may include silicon oxide. When the first source gas includes an ammonia ($NH_3$) gas, a nitrous oxide ($N_2O$) gas and a silane ($SiH_4$) gas, the first thin layer including silicon oxynitride may be formed on the substrate.

As described above, after introducing the first source gas having the composition suitable for forming the first thin layer having the desired composition into the chamber, the first plasma is generated to thereby form the first thin film on the substrate. Thus, the first thin layer may have a stoichiometrical composition and also a non-stoichiometrical composition.

Additionally, since the second time t2 for forming the first plasma is greatly reduced in comparison with that of a conventional method, the temperature of the chamber may not substantially increase. Thus, the first thin layer may be formed on the substrate at a room temperature, for example. Furthermore, damage to an underlying layer and/or an underlying structure positioned below the first thin layer caused by the first plasma may be effectively prevented.

In some embodiments of the present invention, a second source gas may be provided onto the substrate for a third time t3. The second source gas may have a composition substantially different from that of the first source gas. When the second source gas is introduced into the chamber, the first thin layer may be positioned on the substrate. While providing the second source gas onto the substrate, a second plasma is generated in the chamber for a fourth time t4 substantially shorter than the third time t3. Thus, a second thin layer may be formed on the first thin layer formed on the substrate. The second thin layer may have a composition substantially different from that of the first thin layer. As a result, a thin layer structure having a desired composition may be formed on the substrate.

In some embodiments of the present invention, a heat treatment process may be performed on the thin layer so that the thin layer may have a nanocrystalline structure including uniform particle sizes and a uniform density. The heat treatment process will be illustrated in detail later.

Method of Forming a Silicon Oxide Layer

Hereinafter, a method of forming a silicon oxide layer in accordance with some embodiments of the present invention will be described.

A substrate is loaded into a chamber for an HDP process. An inactive gas is introduced into the chamber until the chamber has a desired temperature and a desired pressure. For example, the chamber has a temperature of about 20° C. to about 100° C.

After introducing the inactive gas into the chamber is stopped, a silicon source gas and an oxygen source gas are provided onto the substrate for a first time. The silicon source gas and the oxygen source gas are chemisorbed onto the substrate.

The silicon source gas may include a silane ($SiH_4$) gas and the oxygen source gas may include an oxygen ($O_2$) gas. A flow rate ratio between the oxygen ($O_2$) gas and the silane ($SiH_4$) gas may be in a range of about 0.005:1.0 to about 2.0:1.0.

While providing the silicon source gas and the oxygen source gas onto the substrate, a plasma is generated in the chamber for a second time substantially shorter than the first time. Thus, the silicon oxide layer is formed on the substrate. The second time for generating the plasma may be in the range of about 0.05 seconds to about 5.0 seconds.

When the flow rate ratio between the oxygen gas and the silane gas is in the range of about 0.005:1.0 to about 2.0:1.0, an atomic ratio between silicon (Si) and oxygen (O) in the silicon oxide layer may be in a range of about 1.0:0.1 to about 1.0:2.0. In other words, when a chemical formula of the silicon oxide layer is represented by $SiO_X$, X may be in a range of about 0.1 to about 2.0.

When the flow rate ratio of the oxygen gas relative to the silane gas is lowered to about 0.005, a content of silicon in the silicon oxide layer may increase so that the silicon oxide layer may have a silicon-rich composition. When the flow rate ratio of the oxygen gas relative to the silane gas is augmented to about 2.0, the silicon oxide layer may have a stoichiometrically stable composition of $SiO_2$.

As described above, by varying flow rates of the oxygen gas and the silane gas, the silicon oxide layer may have a stoichiometrical composition of $SiO_X$ in which X is generally about 2.0, whereas the silicon oxide layer may have a non-stoichiometrical composition of $SiO_X$ in which X is smaller than about 2.0.

Compositions and refraction indexes (RI) of the silicon oxide layers formed by varying the flow rates of the oxygen gas and the silane gas are shown in following Table 1. In Table 1, composition ratios between oxygen and silicon in the silicon oxide layers are measured using x-ray photoelectron spectroscopy (XPS).

TABLE 1

| Sample No. | $O_2/SiH_4$ | Refraction Index | Value of X in $SiO_x$ |
| --- | --- | --- | --- |
| 1 | 1.2 | 1.48 | 1.98 |
| 2 | 1.0 | 1.51 | 2.00 |
| 3 | 0.8 | 1.83 | 1.52 |
| 4 | 0.7 | 1.99 | 1.30 |
| 5 | 0.6 | 2.19 | 1.14 |
| 6 | 0.4 | 2.23 | 0.75 |

As shown in Table 1, when the flow rate ratio of the oxygen gas relative to the silane gas is in a range of about 0.4 to about 0.8, the silicon oxide layers may have non-stoichiometrical compositions of $SiO_X$ in which X is in a range of about 0.75 to about 1.51. On the contrary, when the flow rate ratio of the oxygen gas relative to the silane gas is in a range of about 1.0 to about 1.2, the silicon oxide layers may have stoichiometrical compositions of $SiO_X$ in which X is in a range of about 1.98 to about 2.00.

Method of Forming a Thin Layer Including Nanocrystalline Silicon

Hereinafter, a method of forming a thin layer including nanocrystalline silicon in accordance with some embodiments of the present invention will be described.

In order to form the thin layer including nanocrystalline silicon, extra silicon in the thin layer forms a silicon cluster and then the silicon cluster is crystallized. Thus, an initial thin layer converted to the thin layer including nanocrystalline silicon may have a silicon-rich composition containing an excessive content of silicon.

Therefore, the above process is performed so that the initial thin layer for forming the thin layer including nanocrystalline silicon may have a composition of $SiO_X$ in which X is in a range of about 0.1 to about 1.8.

Hereinafter, a method of forming a silicon-rich oxide layer will be described.

After a substrate is loaded into a chamber for an HDP process, an inactive gas is introduced into the chamber until the chamber has a desired temperature and a desired pressure. The temperature in the chamber may be in a range of about 20° C. to about 100° C.

After introducing the inactive gas into the chamber is stopped, a silane ($SiH_4$) gas and an oxygen ($O_2$) gas are provided onto the substrate for a first time so that the silane gas and the oxygen gas are chemisorbed onto the substrate. Here, a flow rate ratio between the oxygen gas and the silane gas may be in a range of about 0.04:1.0 to about 0.8:1.0.

While providing the silane gas and the oxygen gas onto the substrate, a plasma is generated in the chamber for a second time substantially shorter than the first time. Hence, the silicon-rich oxide layer is formed on the substrate. The plasma may be generated for the second time of about 0.05 seconds to about 5.0 seconds.

The silicon-rich oxide layer formed on the substrate may have a composition of $SiO_X$ in which X is in the range of about 0.1 to about 1.8 by adjusting the flow rate ratio between the oxygen gas and the silane gas. The silicon-rich oxide layer may include bonds of silicon and oxygen and further includes bonds of silicon-hydrogen.

When the silicon-rich oxide layer is thermally treated, silicon crystals in the silicon-rich oxide layer may be extracted. Particularly, when a heat treatment process is performed on the silicon-rich oxide layer, the relatively weak bonds of silicon and hydrogen may be broken, thereby generating dangling bonds of silicon in the silicon-rich oxide layer. These dangling bonds of silicon may combine with one another to thereby form silicon clusters in the silicon-rich oxide layer, and then the silicon clusters may be crystallized to generate nanocrystalline silicon in the thin layer. That is, the silicon-rich oxide layer may be changed into the thin layer including nanocrystalline silicon through the heat treatment process.

In some embodiments of the present invention, the heat treatment process may be carried out at a temperature of about 700° C. to about 1,200° C. and under an inactive gas atmosphere. For example, the inactive gas includes an argon gas, a nitrogen gas, etc. Alternatively, the heat treatment process may be carried out at a temperature of about 700° C. to about 1,200° C. and under a mixed gas atmosphere including an oxygen gas and an inactive gas such as nitrogen gas.

In addition, in some embodiments of the present invention, the heat treatment process may be performed in a furnace containing the silicon-rich oxide layer therein, and is referred to as a furnace heat treatment process. The furnace heat treatment process may be performed for about 10 minutes to about 1 hour and 20 minutes. When the temperature of the heat treatment process is relatively high, a process time of the heat treatment process may decrease. On the other hand, when the temperature of the heat treatment process is relatively low, the process time of the heat treatment process may increase.

Alternatively, the heat treatment process may be performed by a flash annealing process, which is performed using a heat radiation produced by a flash lamp or a discharge lamp just for about 10 milli-seconds (ms). The flash lamp may include a xenon lamp, a mercury lamp, etc. The flash annealing process may not be performed in the furnace. Thus, an internal temperature of the furnace does not matter, but a temperature of a semiconductor substrate on which the silicon-rich oxide layer is formed does matter. For example, the semiconductor substrate may be heated to a temperature below about 500° C. before the flash annealing process is performed.

According to the above-described process, the thin layer may include nanocrystalline silicon having particle sizes of about 20 Å to about 50 Å. The particle sizes and a density of the nanocrystalline silicon may vary according to a silicon content of the silicon-rich oxide layer. Furthermore, the nanocrystalline silicon may be uniformly distributed in the thin layer, and the thin layer including nanocrystalline silicon may have a uniform density.

In some embodiments of the present invention, a thin layer including nanocrystalline silicon may be formed by performing a heat treatment process on a silicon-rich oxide layer having a composition of $SiO_{0.7}$ at a temperature of about 1,100° C. for about 1 hour under an argon gas atmosphere. The nanocrystalline silicon in the thin layer is identified through a photo luminescence (PL) test.

Figure 4:
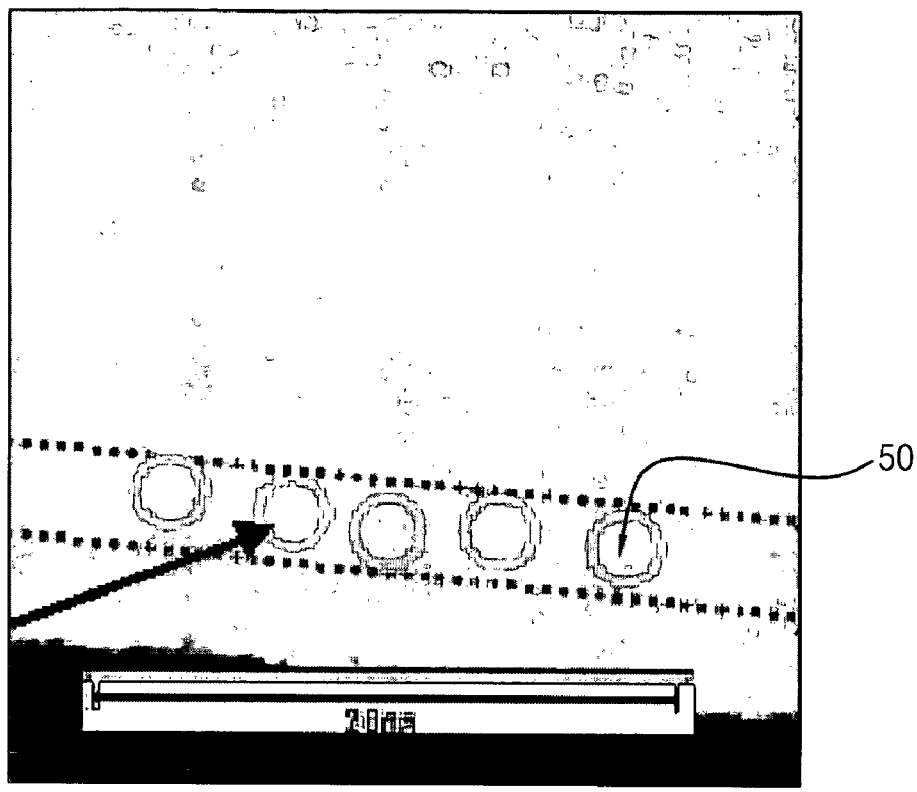
FIG. 4 is an electron microscopic picture showing a cross-section of a thin layer including nanocrystalline silicon in accordance with some embodiments of the present invention.

FIG. 4 is an electron microscopic picture showing a cross-section of a thin layer including nanocrystalline silicon in accordance with some embodiments of the present invention. In FIG. 4, the cross-section of the thin layer including nanocrystalline silicon is obtained using a transmission electron microscope (TEM).

Referring to FIG. 4, nanocrystalline silicon particles 50 having diameters of about 25 Å are uniformly formed in the thin layer.

As described above, the silicon-rich oxide layer having a desired composition of silicon and oxygen is formed, and then a heat treatment is performed on the silicon-rich oxide layer to form the thin layer including nanocrystalline silicon. Thus, the nanocrystalline silicon particles in the thin layer may have proper sizes, a uniform distribution and a uniform density. In addition, a non-volatile semiconductor device having the thin layer including the nanocrystalline silicon may have an improved programming/erasing speed.

Method of Manufacturing a Non-volatile Semiconductor Device

FIGS. 5 to 10 are cross-sectional views illustrating a method of manufacturing a non-volatile semiconductor device in accordance with some embodiments of the present invention.

Figure 5:
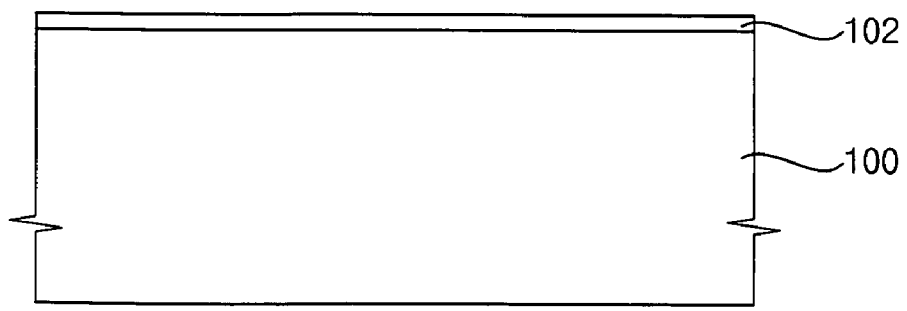
FIGS. 5 to 10 are cross-sectional views illustrating a method of manufacturing a non-volatile semiconductor device in accordance with some embodiments of the present invention.

Referring to FIG. 5, an active region and a field region are defined on a substrate 100 by an isolation process such as a shallow trench isolation (STI) process.

A tunnel oxide layer 102 is formed on the substrate 100. The tunnel oxide layer 102 may be formed on the substrate 100 by depositing silicon oxide ($SiO_2$) having a stoichiometrically stable composition. The tunnel oxide layer 102 may have a thickness of about 10 Å to about 50 Å. As the thickness of the tunnel oxide layer 102 becomes thicker, the data retention of the non-volatile semiconductor device may be higher. Alternatively, the tunnel oxide layer 102 may be formed on the substrate 100 by a thermal oxidation process.

Figure 6:
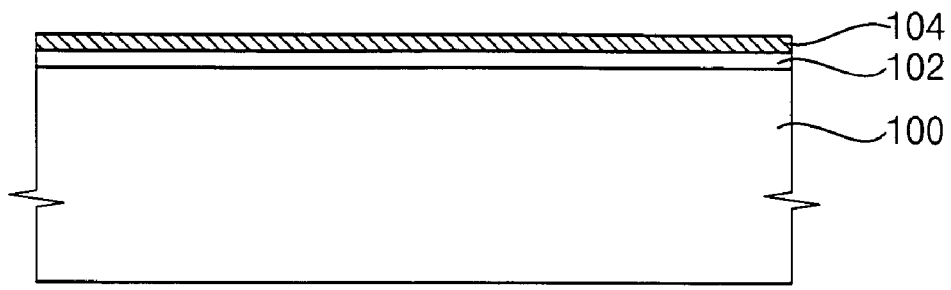

Referring to FIG. 6, a source gas including at least a silicon source gas is provided onto the tunnel oxide layer 102 for a first time. Thus, the source gas is chemisorbed onto the tunnel oxide layer 102. While the source gas is provided onto the tunnel oxide layer 102, a plasma is generated over the substrate 100 for a second time substantially shorter than the first time. Hence, a preliminary storage layer 104 including silicon is formed on the tunnel oxide layer 102. The plasma may be generated periodically over the substrate 100 while the source gas is provided onto the tunnel oxide layer 102.

Figure 8:
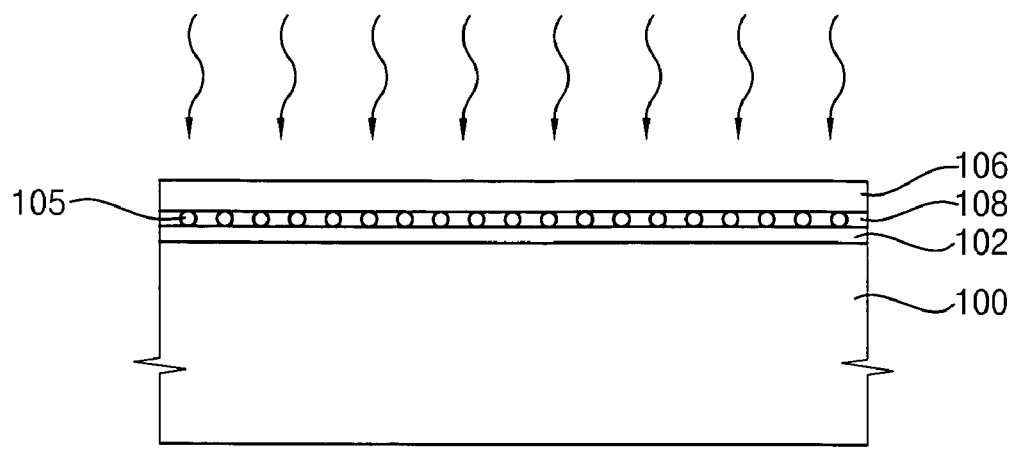

The preliminary storage layer 104 is employed for forming a nanocrystalline silicon storage layer 108 (see FIG. 8). Thus, the preliminary storage layer 104 may be formed using silicon oxide having an increased content of silicon so that nanocrystalline silicon in the preliminary storage layer 104 may be easily extracted. The preliminary storage layer 104 may have a composition of $SiO_X$ in which X is in a range of about 0.1 to about 1.8. For example, the preliminary storage layer 104 has a composition of $SiO_X$ in which X is in a range of about 0.6 to about 1.6.

In some embodiments of the present invention, the source gas for forming the preliminary storage layer 104 may include an oxygen ($O_2$) gas and a silane ($SiH_4$) gas. A flow rate ratio between the oxygen gas and the silane gas may be in a range of about 0.4:1.0 to about 0.8:1.0. While the oxygen gas and the silane gas are provided onto the tunnel oxide layer 102, the plasma may be periodically generated over the substrate 100. The second time for generating the plasma once may be in a range of about 0.05 seconds to about 5.0 seconds.

The preliminary storage layer 104 may have a thickness of about 30 Å to about 150 Å for a non-volatile semiconductor device including a gate structure that has a width below about 70 nm. When the preliminary storage layer 104 including silicon has a thin thickness so that the nanocrystalline silicon storage layer 108 has a thin thickness, a programming/erasing (P/E) speed of the non-volatile semiconductor device may be low, but the data retention of the non-volatile semiconductor device may be high.

Alternatively, prior to forming the preliminary storage layer 104, an upper portion of the tunnel oxide layer 102 may be nitrated by a plasma such as nitrogen plasma to form a nitride layer (not shown). When the nitride layer is formed on the preliminary storage layer 104, the non-volatile semiconductor device may have an improved P/E speed.

Figure 7:
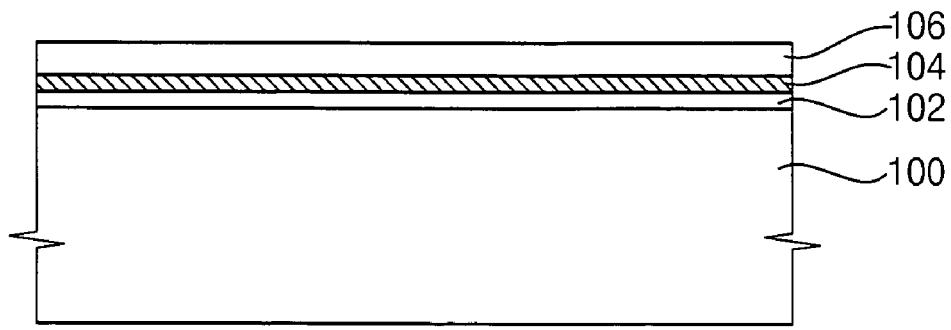

Referring to FIG. 7, a control oxide layer 106 is formed on the preliminary storage layer 104. The control oxide layer 106 may be formed using silicon oxide ($SiO_2$) having a stoichiometrically stable composition. Alternatively, the control oxide layer 106 may be formed using a metal oxide having a high dielectric constant. For example, the control oxide layer 106 is formed using aluminum oxide ($Al_2O_3$) having a high dielectric constant. When the control oxide layer 106 is formed using the metal oxide having the high dielectric constant, the P/E speed of the non-volatile semiconductor device is higher than that of the non-volatile semiconductor device with the control oxide layer 106 using silicon oxide ($SiO_2$).

Referring to FIG. 8, the preliminary storage layer 104 is converted into a storage layer 108 including nanocrystalline silicon by performing a heat treatment process on the substrate 100 on which the tunnel oxide layer 102, the preliminary storage layer 104 and the control oxide layer 106 are sequentially formed. The storage layer 108 including nanocrystalline silicon is referred to as the nanocrystalline silicon storage layer 108.

When the heat treatment process is performed about the preliminary storage layer 104, extra silicon in the preliminary storage layer 104 forms silicon clusters in the preliminary storage layer 104 having the non-stoichiometrical composition, and then the silicon clusters are crystallized to thereby form nanocrystalline silicon 105. Thus, the nanocrystalline silicon storage layer 108 is formed from the preliminary storage layer 104. However, since the control oxide layer 106 and the tunnel oxide layer 102 have the stoichiometrically stable compositions without extra silicon therein, nanocrystalline silicon 105 are not generated in the control oxide layer 106 and the tunnel oxide layer 102 in the heat treatment process.

In some embodiments of the present invention, the heat treatment process is carried out at a temperature of about 700° C. to about 1,200° C. and under an inactive gas atmosphere. For example, the inactive gas includes an argon gas, a nitrogen gas, etc.

Alternatively, the heat treatment process is carried out at the temperature of about 700° C. to about 1,200° C. and under a mixed atmosphere of an oxygen gas and an inactive gas such as nitrogen gas.

In addition, in some embodiments of the present invention, the heat treatment process may be performed in a furnace containing the silicon-rich oxide layer therein, and is referred to as a furnace heat treatment process. The furnace heat treatment process may be performed for about 10 minutes to about 1 hour and 20 minutes. When the temperature of the heat treatment process is relatively high, a process time of the heat treatment process may decrease. On the other hand, when the temperature of the heat treatment process is relatively low, the process time of the heat treatment process may increase.

Alternatively, the heat treatment process may be performed by a flash annealing process, which is performed using a heat radiation produced by a flash lamp or a discharge lamp just for about 10 ms. The flash lamp may include a xenon lamp, a mercury lamp, etc. The flash annealing process may not be performed in the furnace. Thus, an internal temperature of the furnace does not matter, but a temperature of a semiconductor substrate on which the silicon-rich oxide layer is formed does matter. For example, the semiconductor substrate may be heated to a temperature below about 500° C. before the flash annealing process is performed.

When the flash annealing process is performed, even though a process time for annealing is short, sufficient nanocrystalline silicon may be formed. In addition, the non-volatile semiconductor device having the nanocrystalline silicon storage layer 108 formed through the flash annealing process, may have a higher P/E speed, a higher data retention and a better endurance than those of the non-volatile semiconductor device having the nanocrystalline silicon storage layer 108 formed through the furnace heat treatment process.

Figure 9:
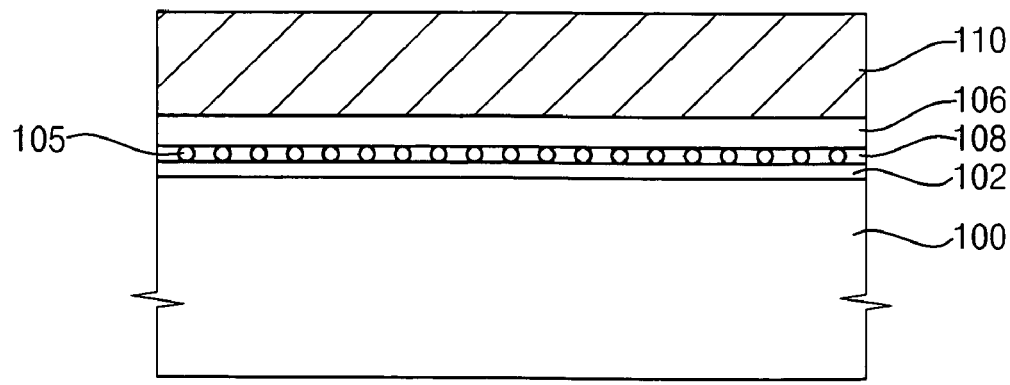

Referring to FIG. 9, a conductive material is deposited on the control oxide layer 106 so that a control electrode layer 110 may be formed on the control oxide layer 106. The control electrode layer 110 may be formed using doped polysilicon or may be a composite layer having doped polysilicon and silicide.

Figure 10:
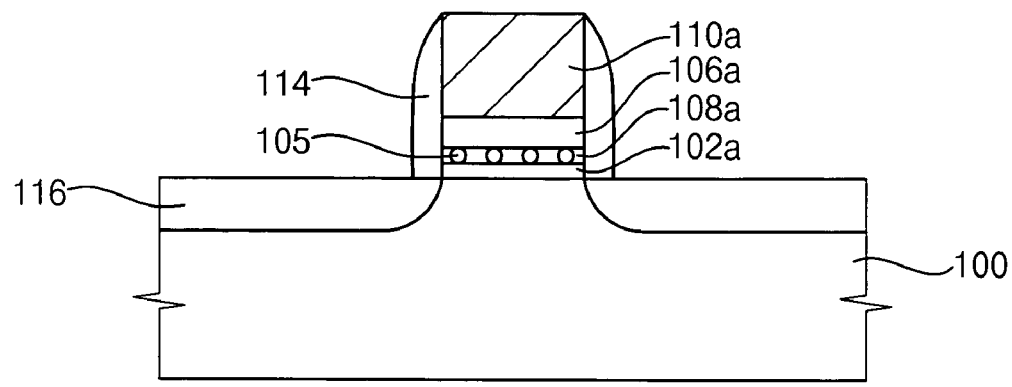

Referring to FIG. 10, the control electrode layer 110, the control oxide layer 106, the nanocrystalline silicon storage layer 108 and the tunnel oxide layer 102 are partially etched to thereby form a gate structure on the substrate 100. The gate structure includes a tunnel oxide layer pattern 102a, a nanocrystalline silicon storage layer pattern 108a, a control oxide layer pattern 106a and a control gate electrode 110a sequentially formed on the substrate 100.

A silicon nitride layer (not shown) is formed on the substrate 100 to cover the gate structure, and then the silicon nitride layer is anisotropically etched to form a spacer 114 on a sidewall of the gate structure.

Source/drain regions 116 are formed at portions of the substrate 100 adjacent to the gate electrode by doping impurities into the portions of the substrate 100.

When the non-volatile semiconductor device includes the nanocrystalline silicon storage layer pattern 108a, data may be stored in the non-volatile semiconductor device by trapping charge in the nanocrystalline silicon 105 of the nanocrystalline silicon storage layer pattern 108a or at intersites among the nanocrystalline silicon 105.

The non-volatile semiconductor device having the above-described construction may have a critical dimension below about 70 nm. Additionally, the non-volatile semiconductor device having the above-described construction may have an P/E speed and a data retention characteristic superior to those of a conventional silicon-oxide-nitride-oxide-silicon (SONOS) device in which charge is trapped in a silicon nitride layer thereof.

Evaluation of Characteristics of a Non-volatile Semiconductor Device

Figure 11:
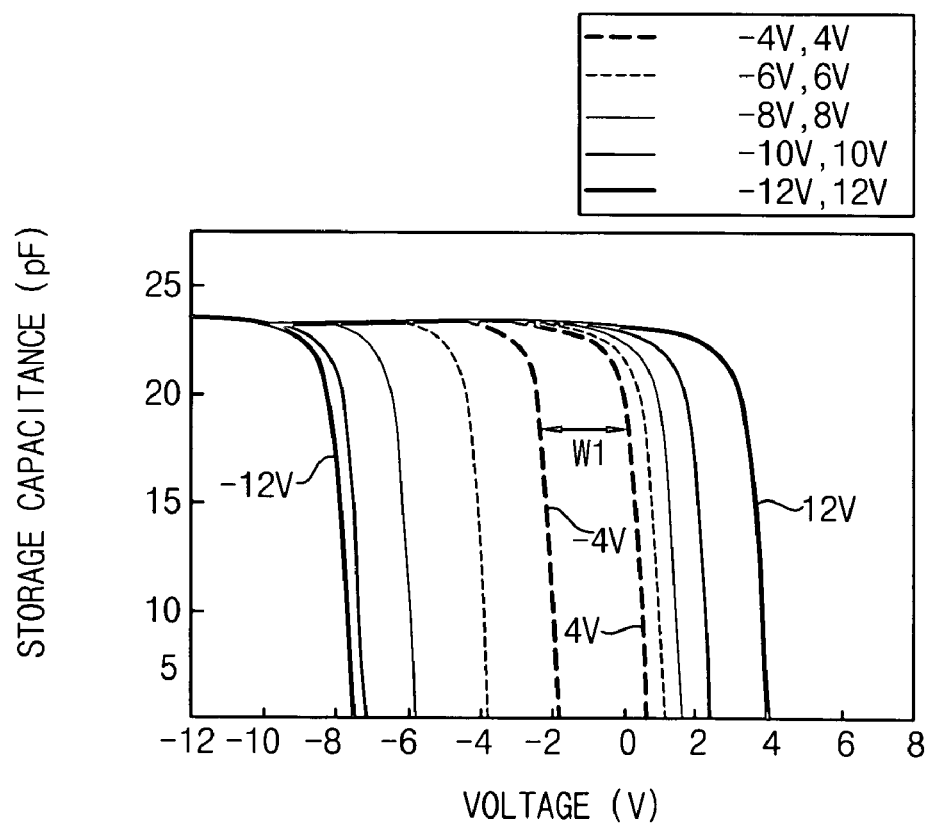
FIG. 11 is a graph showing a storage capacitance of a non-volatile semiconductor device relative to an applied voltage in accordance with some embodiments of the present invention.

FIG. 11 is a graph showing a storage capacitance of a non-volatile semiconductor device relative to an applied voltage in accordance with some embodiments of the present invention.

Here, a tunnel oxide layer pattern of the non-volatile semiconductor device had a thickness of about 20 Å and included silicon oxide ($SiO_2$). A nanocrystalline silicon storage layer pattern of the non-volatile semiconductor device had a thickness of about 40 Å. The nanocrystalline silicon storage layer pattern was obtained by performing a heat treatment process on a silicon-rich oxide ($SiO_{1.3}$) layer formed on the tunnel oxide layer pattern.

In order to analyze storage capacitance-voltage (C-V) characteristics of the non-volatile semiconductor device, after a voltage of about +4V was applied to a control gate electrode of the non-volatile semiconductor device, a first flat-band voltage was measured by measuring the storage capacitances with respect to a variation of the voltages applied to the control gate electrode. Additionally, after a voltage of about −4V was applied to the control gate electrode of the non-volatile semiconductor device, a second flat-band voltage was measured by measuring the storage capacitances with respect to the variation of the voltages applied to the control gate electrode. A memory window of the non-volatile semiconductor device (that is, a difference between the first and the second flat-band voltages) was obtained by measuring the first and the second flat-band voltages. The memory window means a voltage range in which data may be recognized in the non-volatile semiconductor device when programming is performed at the voltage of about +4V and erasing was carried out at the voltage of about −4V.

After voltages of about +6V, +8V, +10V and 12V were applied to the control gate electrode of the non-volatile semiconductor device, each flat-band voltage was measured by respectively measuring the storage capacitances with respect to the variation of the voltages applied to the control gate electrode. In addition, after voltages of about −6V, −8V, −10V and −12V were applied to the control gate electrode of the non-volatile semiconductor device, each flat-band voltage was measured by respectively measuring the storage capacitances with respect to the variation of the voltages applied to the control gate electrode. The memory window was obtained by measuring each flat-band voltage difference at each voltage applied to the control gate electrode.

As shown in FIG. 11, the non-volatile semiconductor device ensures a sufficient memory window. For example, when programming and erasing operations are performed at voltages of about ±6V, the memory window of the non-volatile semiconductor device is above about 5V.

That is, the non-volatile semiconductor device in accordance with some embodiments of the present invention may be programmed and erased at low voltages of about ±6V. Thus, when the non-volatile semiconductor device is employed in various electric or electronic apparatuses, a stress loaded on a storage layer pattern may be reduced, and thus a reliability of the non-volatile semiconductor device may be enhanced.

Figure 12A:
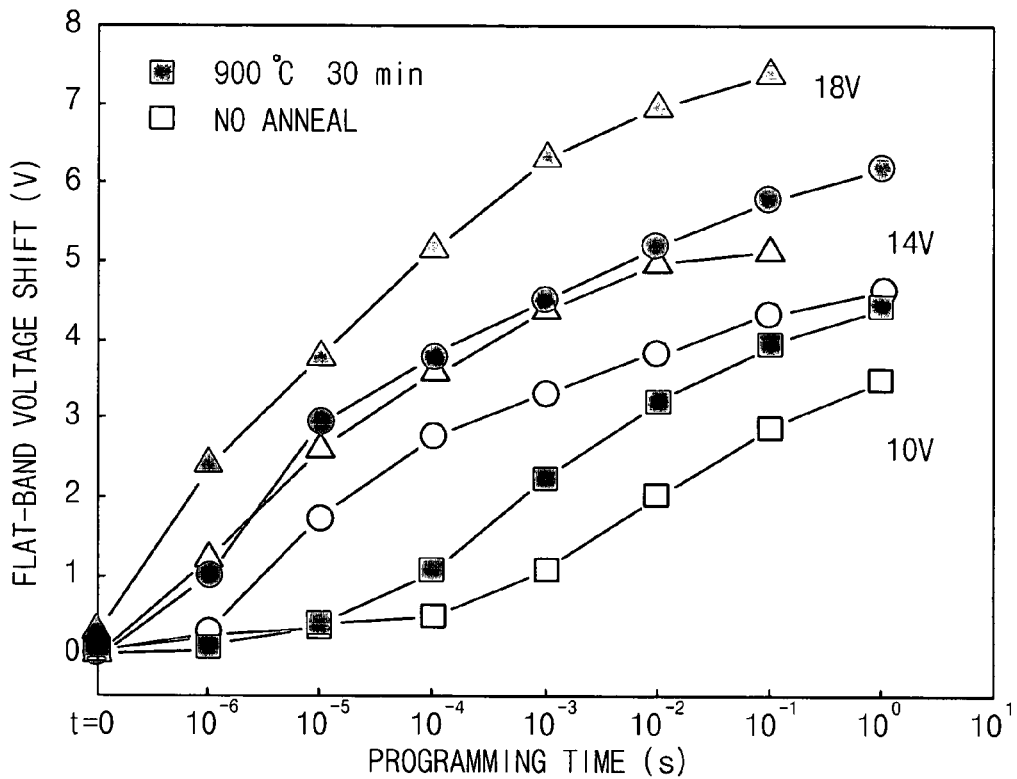
FIGS. 12A and 12B are graphs showing programming and erasing characteristics of a non-volatile semiconductor device before and after a heat treatment process is performed on a silicon-rich oxide layer, respectively, in accordance with some embodiments of the present invention.
Figure 12B:
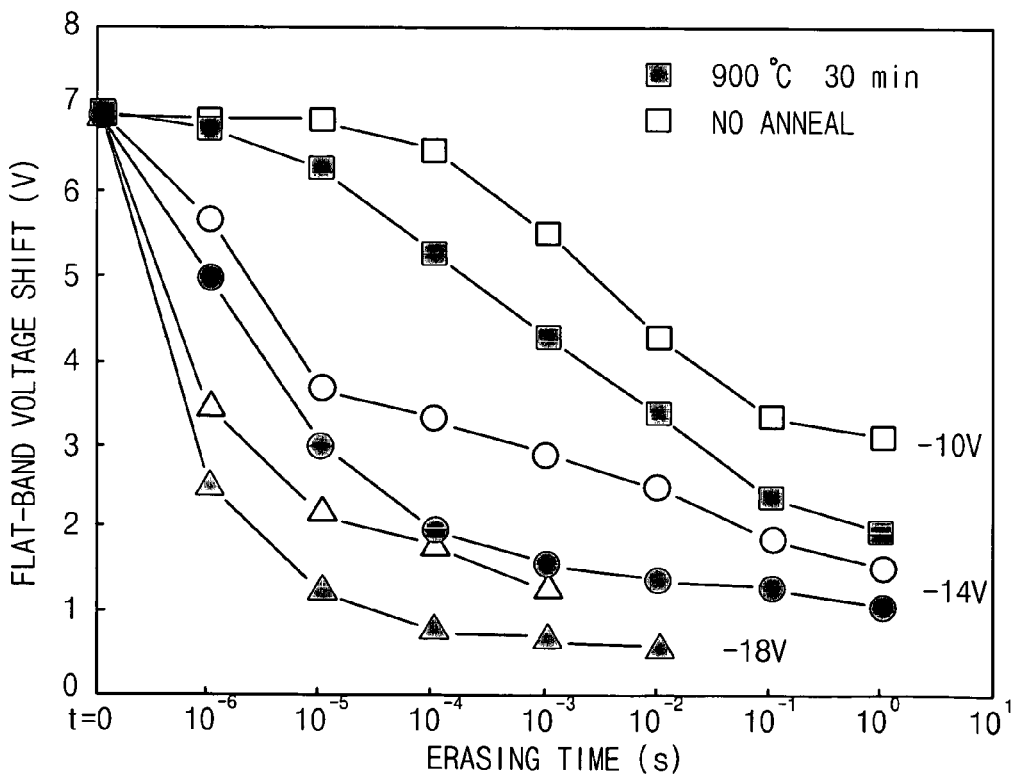

FIGS. 12A and 12B are graphs showing programming and erasing characteristics of a non-volatile semiconductor device before and after a heat treatment process is performed on a silicon-rich oxide layer, respectively, in accordance with some embodiments of the present invention.

Here, a tunnel oxide layer pattern of the non-volatile semiconductor device had a thickness of about 45 Å and included silicon oxide. A nanocrystalline silicon storage layer pattern of the non-volatile semiconductor device had a thickness of about 70 Å. The silicon-rich oxide layer had a composition of $SiO_{0.91}$. The heat treatment process was performed at a temperature of about 900° C. for about 30 minutes.

First, in order to analyze the programming characteristics of the non-volatile semiconductor device, data programmed in the non-volatile semiconductor device were sufficiently erased. Each cell of the non-volatile semiconductor device was programmed by applying a voltage of about +10V to a control gate electrode and by varying times for applying the voltage to the control gate electrode from about $10^{-7}$ seconds to about 1 second. Sequentially, each cell of the non-volatile semiconductor device was programmed by applying voltages of about +14V and +18V to the control gate electrode and by varying times for applying the voltages to the control gate electrode from about $10^{-7}$ seconds to about 1 second.

In addition, in order to analyze the erasing characteristics of the non-volatile semiconductor device, each cell of the non-volatile semiconductor device was sufficiently programmed. Each cell of the non-volatile semiconductor device was erased by applying a voltage of about −10V to the control gate electrode while varying times for applying the voltage to the control gate electrode from about $10^{-7}$ seconds to about 1 second. Sequentially, each cell of the non-volatile semiconductor device was erased by applying voltages of about −14V and −18V to the control gate electrode while varying times for applying the voltages to the control gate electrode from about $10^{-7}$ seconds to about 1 second.

Referring to FIGS. 12A and 12B, flat-band voltage shifts during a unit time at several applied voltages of the non-volatile semiconductor device after the heat treatment is performed are larger than those of the non-volatile semiconductor device before the heat treatment is performed. Thus, the non-volatile semiconductor device may have an increased P/E speed through the heat treatment process.

Figure 13:
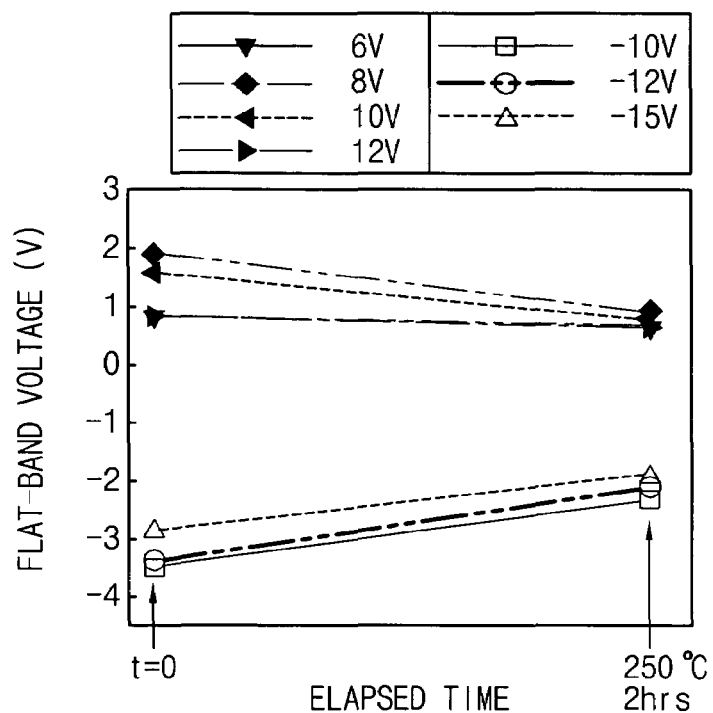
FIG. 13 is a graph showing a flat-band voltage shift of a non-volatile semiconductor device relative to programming and erasing voltages in accordance with some embodiments of the present invention.

FIG. 13 is a graph showing a flat-band voltage shift of a non-volatile semiconductor device relative to programming and erasing voltages in accordance with some embodiments of the present invention.

A tunnel oxide layer pattern of the non-volatile semiconductor device had a thickness of about 20 Å and included silicon oxide. A nanocrystalline silicon storage layer pattern had a thickness of about 60 Å. The nanocrystalline silicon storage layer pattern of the non-volatile semiconductor device was formed by performing a heat treatment process on a silicon-rich oxide ($SiO_{1.3}$) layer formed on the tunnel oxide layer pattern.

In order to analyze the flat-band voltage shift with respect to the programming and the erasing voltages, after a voltage of about +6V was applied to a control gate electrode of the non-volatile semiconductor device, a flat-band voltage was measured by measuring storage capacitances relative to a variation of voltages applied to the control gate electrode. Sequentially, after a stress was applied to the non-volatile semiconductor device at a temperature of about 250° C. for about 2 hours, a flat-band voltage was measured under substantially the same conditions as those before applying the stress to the non-volatile semiconductor device. Data retention characteristics of the non-volatile semiconductor device may be obtained by measuring the flat-band voltages before and after applying the stress to the non-volatile semiconductor device at the voltage of about +6V.

After voltages of about +8V, +10V, +12V, −10V, −12V and −15V were applied to the control gate electrode of the non-volatile semiconductor device, each flat-band voltage was measured by measuring the storage capacitances with respect to the variation of the voltages applied to the control gate electrode. Sequentially, after applying a stress to the non-volatile semiconductor device at a temperature of about 250° C. for about 2 hours, each flat-band voltage was measured with substantially the same conditions as those before applying the stress to the non-volatile semiconductor device. The data retention characteristics of the non-volatile semiconductor device may be obtained by relatively measuring the flat-band voltages before and after applying the stress to the non-volatile semiconductor device at the above voltages.

Referring to FIG. 13, the non-volatile semiconductor device in accordance with some embodiments of the present invention had a very small flat-band voltage difference of about 1V even after receiving the stress at the temperature of about 250° C. for about 2 hours. In general, applying the stress for 2 hours at the temperature of about 250° C. may correspond to applying the stress for 10 years at a room temperature. Thus, the non-volatile semiconductor device in accordance with an example embodiment of the present invention may have data retention characteristics for storing charge therein decreased by about 30% for about 10 years. Thus, the non-volatile semiconductor device may have excellent data retention characteristics.

Figure 14:
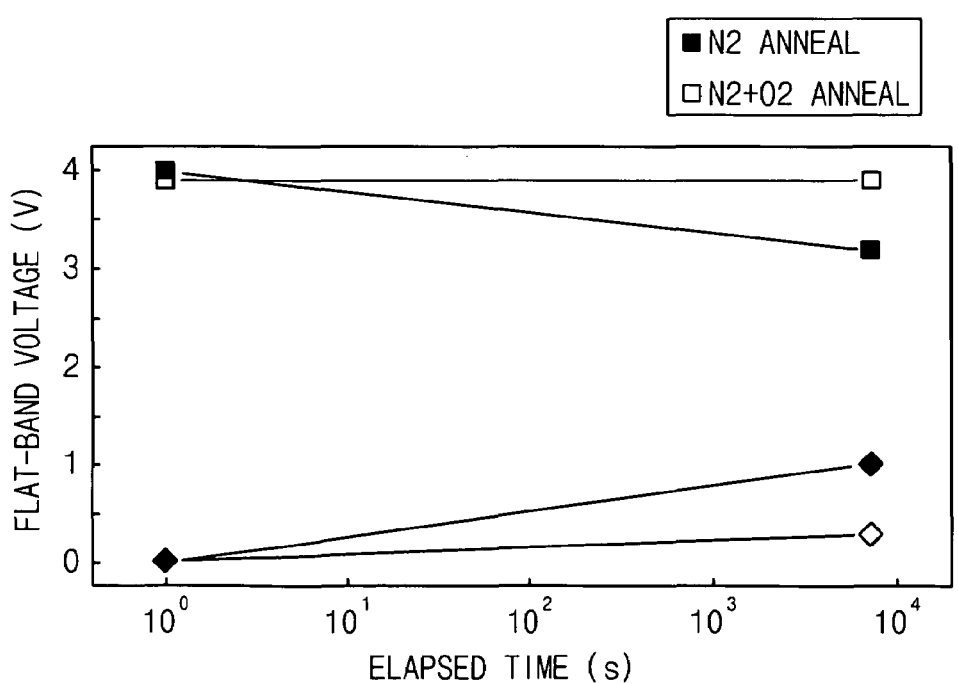
FIG. 14 is a graph showing flat-band voltage shifts of a non-volatile semiconductor device relative to an elapsed time when a heat treatment process is performed under a nitrogen gas atmosphere and when the treatment process is performed under a mixed atmosphere of an oxygen gas and a nitrogen gas in accordance with some embodiments of the present invention.

FIG. 14 is a graph showing flat-band voltage shifts of a non-volatile semiconductor device relative to an elapsed time when a heat treatment process is performed under a nitrogen gas atmosphere and when the treatment process is performed under a mixed atmosphere of an oxygen gas and a nitrogen gas in accordance with some embodiments of the present invention.

A tunnel oxide layer pattern of the non-volatile semiconductor device had a thickness of about 35 Å and included silicon oxide. A nanocrystalline silicon storage layer pattern had a thickness of about 70 Å. The nanocrystalline silicon storage layer pattern of the non-volatile semiconductor device was formed by performing a heat treatment process on a silicon-rich oxide ($SiO_{0.91}$) layer formed on the tunnel oxide layer pattern. A control oxide layer pattern including aluminum oxide having a high dielectric constant had a thickness of about 150 Å.

Referring to FIG. 14, when the heat treatment process was performed under the mixed atmosphere of the oxygen gas and the nitrogen gas, the non-volatile semiconductor device had a flat-band voltage difference smaller than that of the non-volatile semiconductor device when the heat treatment process is performed under the nitrogen gas atmosphere. Thus, the non-volatile semiconductor device may have good data retention characteristics by performing the heat treatment process under the mixed atmosphere of the oxygen gas and the nitrogen gas.

Figure 15:
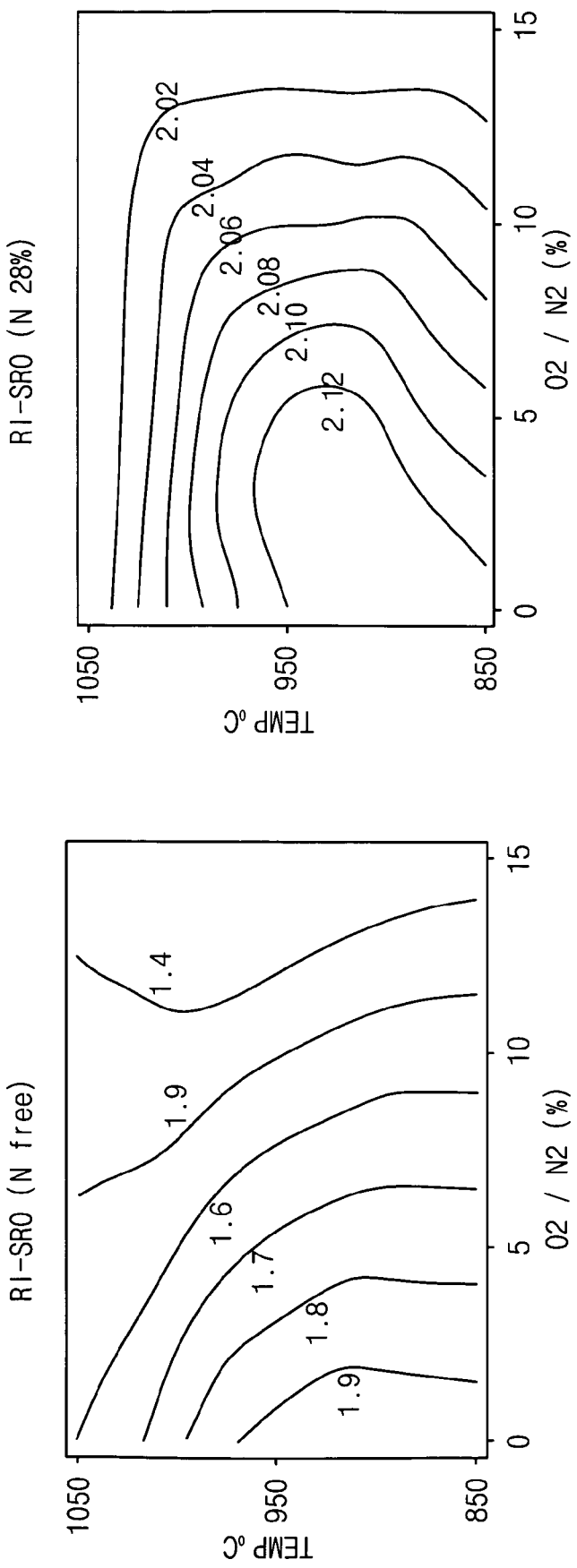
FIG. 15 is an RI diagram showing RI variations of a silicon-rich oxide layer and a silicon-rich oxynitride layer, respectively, with respect to a temperature and a flow rate ratio of an oxygen gas relative to a nitrogen gas in a heat treatment process.

FIG. 15 is an RI diagram showing RI variations of a silicon-rich oxide layer and a silicon-rich oxynitride layer, respectively, with respect to a temperature and a flow rate ratio of an oxygen gas relative to a nitrogen gas in a heat treatment process.

Here, the silicon-rich oxide layer had a thickness of about 90 Å and had a composition of $SiO_{0.91}$. In addition, the silicon-rich oxynitride layer had a thickness of about 90 Å and a composition of $SiO_{0.91}N$. The silicon-rich oxynitride layer had a nitrogen content of 28% by weight.

Referring to FIG. 15, when the heat treatment process was performed under a mixed atmosphere of the oxygen gas and the nitrogen gas, as a flow rate ratio of the oxygen gas relative to the nitrogen gas increased, the silicon-rich oxide layer had a decreased value of RI, but the silicon-rich oxynitride layer had a hardly decreased value of RI. A P/E speed of a non-volatile semiconductor device having the silicon-rich layer increases proportionally to a value of RI. Thus, the non-volatile semiconductor device having the silicon-rich oxide layer may have a decreased P/E speed after the heat treatment process is performed under the mixed atmosphere of the oxygen gas and the nitrogen gas in comparison with that after the heat treatment process is performed under the nitrogen gas atmosphere. However, the non-volatile semiconductor device having the silicon-rich oxynitride layer may have a similar P/E speed after the heat treatment process is performed under the mixed atmosphere of the oxygen gas and the nitrogen gas in comparison with that after the heat treatment process is performed under the nitrogen gas atmosphere.

Figure 16:
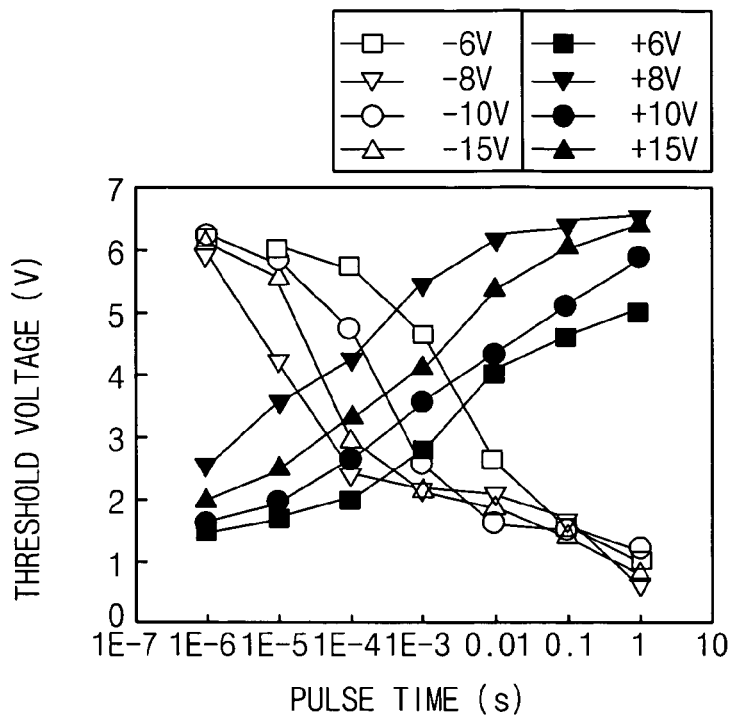
FIG. 16 is a graph showing programming and erasing characteristics of a non-volatile semiconductor device in accordance with some embodiments of the present invention.

FIG. 16 is a graph showing programming and erasing characteristics of a non-volatile semiconductor device in accordance with some embodiments of the present invention.

Here, the tunnel oxide layer pattern of the non-volatile semiconductor device had a thickness of about 20 Å and included silicon oxide. A nanocrystalline silicon storage layer pattern of the non-volatile semiconductor device had a thickness of about 60 Å. The nanocrystalline silicon storage layer pattern was formed by performing a heat treatment process on a silicon-rich oxide ($SiO_{1.3}$) layer formed on the tunnel oxide layer pattern.

First, in order to analyze the programming characteristics of the non-volatile semiconductor device, data programmed in the non-volatile semiconductor device were sufficiently erased. Each cell of the non-volatile semiconductor device was programmed by applying a voltage of about +6V to a control gate electrode and by varying times for applying the voltage to the control gate electrode from about $10^{-7}$ seconds to about 1 second. Sequentially, each cell of the non-volatile semiconductor device was programmed by applying voltages of about +8V, +10V and +15V to the control gate electrode and by varying times for applying the voltages to the control gate electrode from about $10^{-7}$ seconds to about 1 second.

In addition, in order to analyze the erasing characteristics of the non-volatile semiconductor device, each cell of the non-volatile semiconductor device was sufficiently programmed. Each cell of the non-volatile semiconductor device was erased by applying a voltage of about −6V to the control gate electrode while varying times for applying the voltage to the control gate electrode from about $10^{-7}$ seconds to about 1 second. Sequentially, each cell of the non-volatile semiconductor device was erased by applying voltages of about −8V, −10V and −15V to the control gate electrode while varying times for applying the voltages to the control gate electrode from about $10^{-7}$ seconds to about 1 second.

Referring to FIG. 16, when the time for applying the positive voltage is above 0.01 seconds, each cell of the non-volatile semiconductor device may be programmed at a voltage of about +6V to about +15V. When the time for applying the negative voltage is above 0.01 seconds, each cell of the non-volatile semiconductor device may be erased at a voltage of about −15V to about −6V. Particularly, when the time for applying the positive voltage is above 0.001 seconds, each cell of the non-volatile semiconductor device may be programmed at the voltage of about +15V. When the time for applying the negative voltage is above 0.001 seconds, each cell of the non-volatile semiconductor device may be erased at the voltage of about −15V.

As described above, the non-volatile semiconductor device in accordance with some embodiments of the present invention may have an erasing speed faster than that of the conventional SONOS device.

Figure 17:
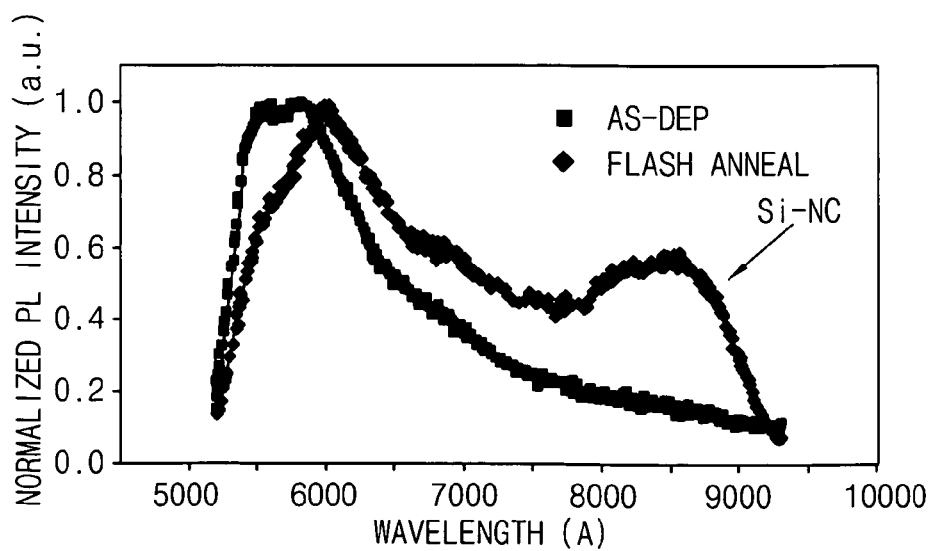
FIG. 17 is a graph showing photo luminescence (PL) intensities of a silicon-rich oxide layer of a non-volatile semiconductor device relative to a wavelength in accordance with some embodiments of the present invention before and after a flash annealing process is performed on a silicon-rich oxide layer.

FIG. 17 is a graph showing photo luminescence (PL) intensities of a silicon-rich oxide layer of a non-volatile semiconductor device relative to a wavelength in accordance with some embodiments of the present invention before and after a flash annealing process is performed on a silicon-rich oxide layer.

Referring to FIG. 17, after the flash annealing process was performed on the silicon-rich oxide layer, the PL intensity of the silicon-rich oxide layer had two peaks relative to the wavelength. One peak of the PL intensity of the silicon-rich oxide layer after the flash annealing process was performed is positioned near a peak of the PL intensity of the silicon-rich oxide layer before the flash annealing process was performed (see the graph represented by "As-dep"). The other peak of the PL intensity of the silicon-rich oxide layer after the flash annealing process was performed is positioned far from the peak of the PL intensity of the silicon-rich oxide layer before the flash annealing process was performed, which means that a particle such as a nanocrystalline silicon was formed after the flash annealing process was performed. Thus, the nanocrystalline silicon may be formed through the flash annealing process.

Figure 18:
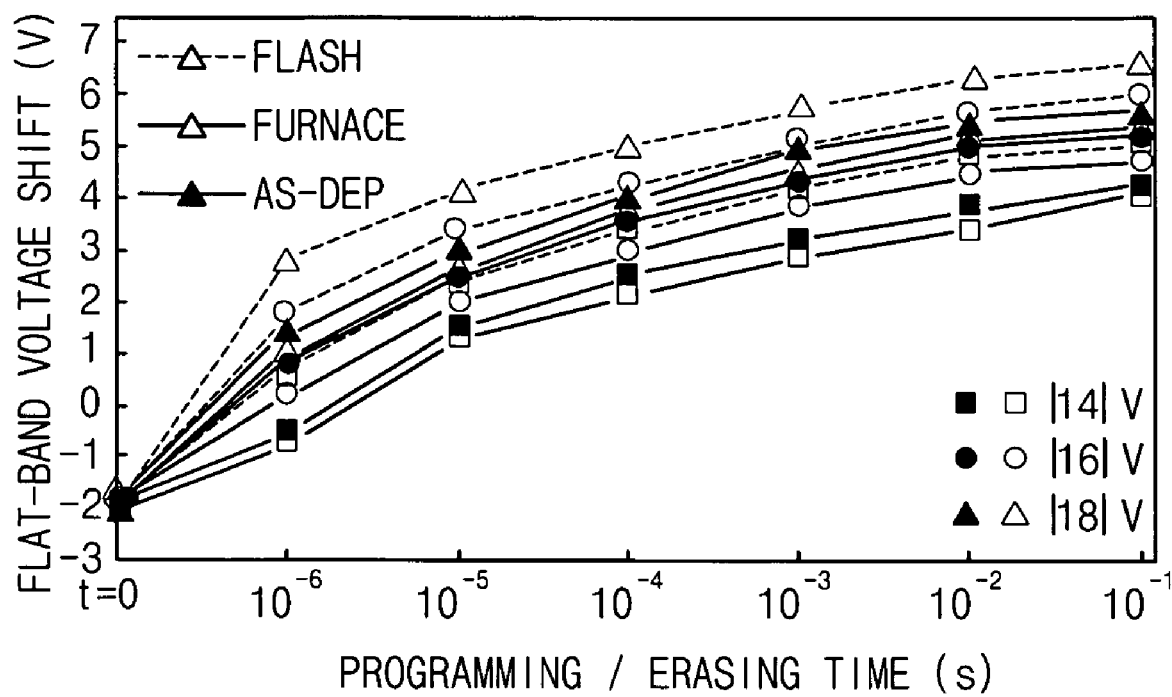
FIG. 18 is a graph showing programming characteristics of a non-volatile semiconductor device before any heat treatment process is performed, after a furnace heat treatment process is performed, and a flash annealing process is performed, respectively, on a silicon-rich oxide layer in accordance with some embodiments of the present invention.

FIG. 18 is a graph showing programming characteristics of a non-volatile semiconductor device before any heat treatment process is performed, after a furnace heat treatment process is performed, and a flash annealing process is performed, respectively, on a silicon-rich oxide layer in accordance with some embodiments of the present invention.

Here, a tunnel oxide layer pattern of the non-volatile semiconductor device had a thickness of about 45 Å and included silicon oxide. A nanocrystalline silicon storage layer pattern of the non-volatile semiconductor device had a thickness of about 70 Å. The silicon-rich oxide layer had a composition of $SiO_{0.91}$. The furnace heat treatment process was performed at a temperature of about 900° C. for about 30 minutes. The flash annealing process was performed for about 10 ms. A semiconductor substrate on which the silicon-rich oxide layer had been formed was heated to a temperature of about 500° C. before the flash annealing process was performed.

Referring to FIG. 18, flat-band voltage shifts during a unit time at several applied voltages of the non-volatile semiconductor device after the flash annealing process was performed are larger than those of the non-volatile semiconductor device after the furnace heat treatment was performed. In addition, the flat-band voltage shifts during the unit time at the several applied voltages of the non-volatile semiconductor device after performing the flash annealing process are larger than those of the non-volatile semiconductor device before any heat treatment was performed. Thus, the non-volatile semiconductor device may have an increased P/E speed through the furnace heat treatment process, and a more increased P/E speed through the flash annealing process.

Figure 19A:
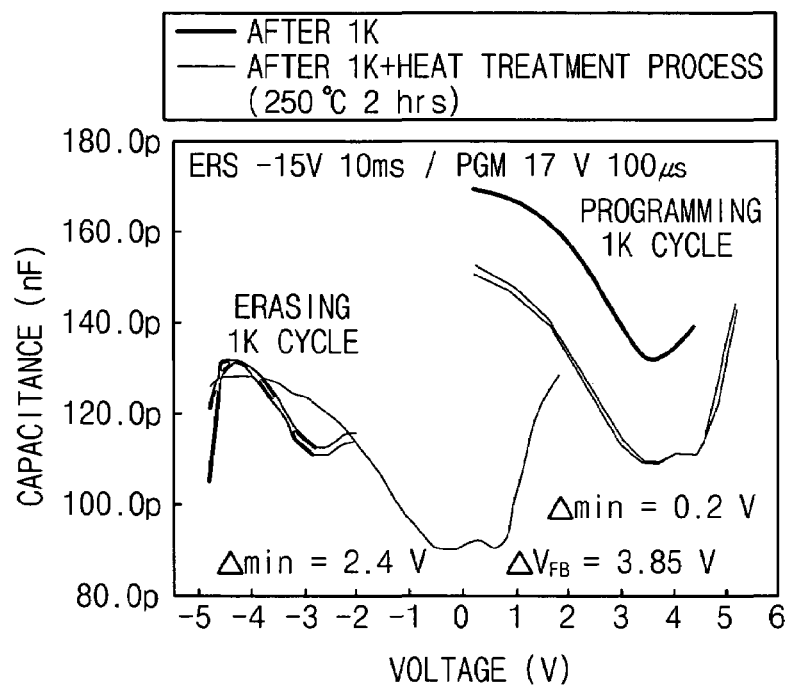
FIGS. 19A and 19B are graphs showing storage capacitances of a non-volatile semiconductor device relative to an applied voltage when a furnace heat treatment process is performed and when a flash annealing process is performed, respectively, on a silicon-rich oxynitride layer in accordance with some embodiments of the present invention.
Figure 19B:
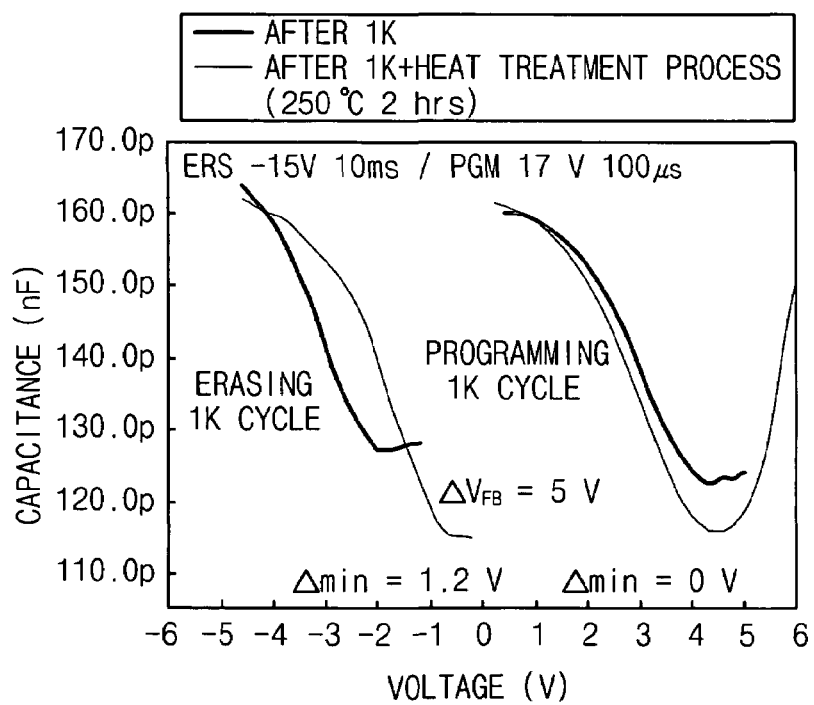

FIGS. 19A and 19B are graphs showing storage capacitances of a non-volatile semiconductor device relative to an applied voltage when a furnace heat treatment process is performed and when a flash annealing process is performed, respectively, on a silicon-rich oxynitride layer in accordance with some embodiments of the present invention.

Here, a tunnel oxide layer pattern of the non-volatile semiconductor device had a thickness of about 45 Å and included silicon oxide ($SiO_2$). A nanocrystalline silicon storage layer pattern of the non-volatile semiconductor device had a thickness of about 70 Å. The nanocrystalline silicon storage layer pattern was obtained by performing a heat treatment process on a silicon-rich oxide ($SiO_{0.91}N$) layer formed on the tunnel oxide layer pattern.

Referring to FIGS. 19A and 19B, voltage difference (Δmin) between applied voltages when a storage capacitance of the silicon-rich oxynitride layer has a lowest value in one cycle of a programming/erasing operation before and after the heat treatment process is performed, respectively, has different values according to a type of the heat treatment process. Particularly, a voltage difference (Δmin) between applied voltages when a storage capacitance of the silicon-rich oxynitride layer had a lowest value in one cycle of a programming/erasing operation before and after the flash annealing process was performed is smaller than that before and after the furnace heat treatment process was performed, which means that a charge loss generated by the flash annealing process is smaller than that by the furnace heat treatment process. Thus, the flash annealing process has an advantage with respect to the data retention of the non-volatile semiconductor device, in comparison with the furnace heat treatment process.

According to some embodiments of the present invention, a thin layer having a stoichiometrical composition or a non-stoichiometrical composition may be easily formed. In addition, nanocrystalline silicon having uniform particles sizes, distribution and density may be formed in the thin layer by adjusting a composition of the thin layer. Moreover, a highly integrated non-volatile semiconductor device having fast programming and erasing speeds and good data retention characteristics may be manufactured by employing the thin layer including the nanocrystalline silicon as a charge storing layer in the non-volatile semiconductor device.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of forming a thin layer comprising:
   providing a first source gas onto a substrate loaded in a chamber for a first time to chemisorb the first source gas onto the substrate; and
   generating a plasma in the chamber for a second time while providing the first source gas onto the substrate to change the chemisorbed first source gas into a first thin film having a desired composition, wherein the second time is substantially shorter than the first time, and
   wherein the step of generating the plasma for the second time is periodically and repeatedly performed while providing the first source gas onto the substrate.

2. The method of claim 1, wherein the second time is in a range of about 0.05 seconds to about 5 seconds.

3. The method of claim 1, wherein periodically generating the plasma is performed by applying a plasma power of about 1,000W to about 7,000W and a bias power of about 13W to about 5,000W.

4. The method of claim 1, further comprising:
   providing a second source gas onto the first thin film for a third time to chemisorb the second source gas onto the first thin film; and
   periodically generating a plasma in the chamber for a fourth time while providing the second source gas onto the first thin film to change the chemisorbed second source gas into a second thin film, wherein the fourth time is substantially shorter than the third time, and wherein the second thin film has a composition substantially different from that of the first thin film.

5. The method of claim 1, wherein the first source gas comprises an oxygen ($O_2$) gas and a silane ($SiH_4$) gas by a flow rate ratio of about 0.005:1.0 to about 2.0: 1.0, and wherein the first thin film comprises silicon oxide.

6. The method of claim 1, wherein the first source gas comprises an oxygen gas and a silane gas by a flow rate ratio of about 0.4:1.0 to about 0.8:1.0, and wherein the first thin film comprises silicon oxide.

7. The method of claim 6, further comprising extracting crystalline silicon in the first thin film by a heat treatment process.

8. The method of claim 1, wherein the first source gas comprises an ammonia ($NH_3$) gas, a nitrous oxide ($N_2O$) gas and a silane gas, and wherein the first thin film comprises silicon oxynitride.

9. A method of forming a thin layer comprising:
   providing a first source gas onto a substrate loaded in a chamber for a first time to chemisorb the first source gas onto the substrate;
   periodically generating a plasma in the chamber for a second time while providing the first source gas onto the substrate to change the chemisorbed first source gas into a first thin film having a desired composition, wherein the second time is substantially shorter than the first time;
   providing a second source gas onto the first thin film for a third time to chemisorb the second source gas onto the first thin film; and
   periodically generating a plasma in the chamber for a fourth time while providing the second source gas onto the first thin film to change the chemisorbed second source gas into a second thin film, wherein the fourth time is substantially shorter than the third time, and wherein the second thin film has a composition substantially different from that of the first thin film.

10. A method of forming a thin layer comprising:
providing a first source gas onto a substrate loaded in a chamber for a first time to chemisorb the first source gas onto the substrate; and
periodically generating a plasma in the chamber for a second time while providing the first source gas onto the substrate to change the chemisorbed first source gas into a first thin film having a desired composition, wherein the second time is substantially shorter than the first time,
wherein the first source gas comprises an oxygen ($O_2$) gas and a silane ($SiH_4$) gas by a flow rate ratio of about 0.005:1.0 to about 2.0:1.0, and wherein the first thin film comprises silicon oxide.

11. A method of forming a thin layer comprising:
providing a first source gas onto a substrate loaded in a chamber for a first time to chemisorb the first source gas onto the substrate; and
periodically generating a plasma in the chamber for a second time while providing the first source gas onto the substrate to change the chemisorbed first source gas into a first thin film having a desired composition, wherein the second time is substantially shorter than the first time,
wherein the first source gas comprises an oxygen gas and a silane gas by a flow rate ratio of about 0.4:1.0 to about 0.8:1.0, and wherein the first thin film comprises silicon oxide.

12. A method of forming a thin layer comprising:
providing a first source gas onto a substrate loaded in a chamber for a first time to chemisorb the first source gas onto the substrate; and
periodically generating a plasma in the chamber for a second time while providing the first source gas onto the substrate to change the chemisorbed first source gas into a first thin film having a desired composition, wherein the second time is substantially shorter than the first time,
wherein the first source gas comprises an ammonia ($NH_3$) gas, a nitrous oxide ($N_2O$) gas and a silane gas, and wherein the first thin film comprises silicon oxynitride.

13. A method of manufacturing a non-volatile semiconductor device comprising:
forming a tunnel oxide layer on a substrate;
providing a source gas onto the substrate for a first time to chemisorb the source gas onto the tunnel oxide layer, the source gas comprising a silicon source gas;
generating a plasma over the substrate for a second time while providing the source gas onto the substrate to change the chemisorbed source gas into a preliminary storage layer, wherein the second time is substantially shorter than the first time;
forming a control oxide layer on the preliminary storage layer;
extracting crystalline silicon in the preliminary storage layer by performing a heat treatment process on the preliminary storage layer to change the preliminary storage layer into a nanocrystalline silicon storage layer;
forming a control electrode layer on the control oxide layer; and
patterning the control electrode layer, the control oxide layer, the nanocrystalline silicon storage layer and the tunnel oxide layer to form a gate structure on the substrate.

14. The method of claim 13, wherein generating the plasma is periodically performed while providing the source gas onto the substrate.

15. The method of claim 14, wherein periodically generating the plasma is performed by applying a plasma power of about 1,000W to about 7,000W and a bias power of about 13W to about 5,000W.

16. The method of claim 13, wherein the second time is in a range of about 0.05 seconds to about 5 seconds.

17. The method of claim 13, wherein the first source gas comprises an oxygen ($O_2$) gas and a silane ($SiH_4$) gas by a flow rate ratio of about 0.4:1.0 to about 0.8:1.0.

18. The method of claim 13, wherein the preliminary storage layer has a composition comprising silicon and oxygen by an atomic ratio of about 1.0:0.1 to about 1.0: 1.8.

19. The method of claim 13, wherein the preliminary storage layer has a thickness of about 30 Å to about 150 Å.

20. The method of claim 13, wherein the tunnel oxide layer has a thickness of about 10 Å to about 50 Å.

21. The method of claim 13, wherein the heat treatment process is performed at a temperature of about 700° C. to about 1,100° C. under an inactive gas atmosphere.

22. The method of claim 13, wherein the heat treatment process is performed at a temperature of about 700° C. to about 1,100° C. under a mixed gas atmosphere comprising an oxygen gas and an inactive gas.

23. The method of claim 13, wherein the heat treatment process is performed for about 20 minutes to about 80 minutes.

24. The method of claim 13, wherein the heat treatment process is performed using a heat radiation produced by a flash lamp for about 10 ms.

25. The method of claim 24, wherein the flash lamp comprises a xenon lamp.

26. The method of claim 13, prior to providing the source gas onto the substrate, further comprising nitrating a surface portion of the tunnel oxide layer to form a nitride layer on the tunnel oxide layer.

27. The method of claim 13, wherein the gate structure has a width below about 70 nm.

* * * * *